(12) United States Patent
Kim

(10) Patent No.: US 7,804,333 B2
(45) Date of Patent: Sep. 28, 2010

(54) INPUT BUFFER CIRCUIT

(75) Inventor: Mi Hye Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 132 days.

(21) Appl. No.: 11/823,180

(22) Filed: Jun. 27, 2007

(65) Prior Publication Data

US 2008/0157827 A1    Jul. 3, 2008

(30) Foreign Application Priority Data

Dec. 29, 2006   (KR) .................... 10-2006-0138795

(51) Int. Cl.
G01R 19/00 (2006.01)
G11C 7/00 (2006.01)
H03F 3/45 (2006.01)

(52) U.S. Cl. .................... 327/52; 327/65; 327/89; 327/108

(58) Field of Classification Search .......... 327/108–112, 327/379, 389, 391, 52, 65, 66, 89, 96, 127, 327/246, 266, 274, 280, 2, 87, 359, 560–563; 326/22–27, 82, 83, 86, 87

See application file for complete search history.

(56) References Cited

U.S. PATENT DOCUMENTS

| 4,611,130 A | * | 9/1986 | Swanson ..................... 327/65 |
| 5,689,460 A | * | 11/1997 | Ooishi .................... 365/189.07 |
| 6,339,344 B1 | * | 1/2002 | Sakata et al. .................. 326/83 |
| 6,650,173 B1 | * | 11/2003 | Khouri et al. ............... 327/538 |
| 6,919,743 B2 | * | 7/2005 | Tobita ........................ 327/108 |
| 6,943,585 B2 | | 9/2005 | Lee et al. |
| 7,049,861 B2 | | 5/2006 | Cowles |
| 2005/0200400 A1 | * | 9/2005 | Takeuchi ..................... 327/536 |
| 2006/0022706 A1 | * | 2/2006 | Do .............................. 326/57 |

FOREIGN PATENT DOCUMENTS

| KR | 10-0295064 B1 | * | 4/2001 |
| KR | 10-0558548 | | 3/2006 |
| KR | 10-0650847 B1 | | 11/2006 |

* cited by examiner

Primary Examiner—Lincoln Donovan
Assistant Examiner—Brandon S Cole
(74) Attorney, Agent, or Firm—John P. White; Cooper & Dunham LLP

(57) ABSTRACT

An input buffer circuit is disclosed. The input buffer circuit includes a buffer configured to receive an input signal and differentially amplify and buffer the received input signal, and a current regulator for regulating the amount of current in the buffer at a turn-on level which depends on a level of a voltage inputted thereto.

10 Claims, 5 Drawing Sheets

INPUT BUFFER CIRCUIT

BACKGROUND

The present disclosure relates to a semiconductor memory device, and more particularly to an input buffer circuit for receiving an input signal and differentially amplifying and buffering the received input signal.

In general, a semiconductor memory device, such as a dynamic random access memory (DRAM), comprises a memory array including a plurality of memory cells for storing data.

Particularly, in a synchronous DRAM (SDRAM) among various DRAMs, a data read/write operation is carried out synchronously with an external clock signal. For this reason, in the SDRAM, there is a need for an input buffer circuit to generate an internal clock signal which is in synchronization with the external clock signal.

A quadri coupled receiver (QCR) buffer is used in a DRAM as such an input buffer circuit.

Such an input buffer circuit receives an address signal or command signal, as well as a clock signal, converts the received signals into internal signals and then supplies the converted internal signals to respective circuit blocks of the DRAM.

In other words, the input buffer circuit acts to receive and amplify an input of an unstable or weak signal received at the DRAM.

Improved performance of a buffer makes it possible to determine, even when a weak input signal is received, whether the input signal is high or low and shorten the time taken for the input signal to be passed through the buffer.

The amount of current used in operation of the buffer is closely connected with the performance of the buffer.

When the amount of current used is larger, the performance of the buffer becomes better, but the power consumption of the buffer also becomes greater. Conversely, when the amount of current used is smaller, the performance of the buffer is degraded, but the power consumption of the buffer can be reduced.

With the ongoing development of high-speed low-power DRAMs, it has become more difficult and important to properly regulate the amount of current in the buffer. However, in a conventional QCR buffer, there is a shortage of a function of flexibly regulating the amount of current.

FIG. 1 is a circuit diagram of a conventional input buffer circuit. A conventional current regulation function will hereinafter be described with reference to FIG. 1.

The amount of current used in a buffer depends on a sink transistor N5. At a design step, the amount of current is controlled by adjusting the size of the sink transistor. However, at a failure analysis step, it is impossible to adjust the size of the sink transistor. For this reason, a redundant sink transistor N6 is set as an option.

In FIG. 1, N5 is a main sink transistor, and N6 is a redundant sink transistor. If a metal option connected to the drain of the sink transistor N6 is open, the sink transistor N6 is not used. If the metal option is closed, the sink transistor N6 is used to increase the amount of current.

In this manner, in the conventional input buffer circuit, the amount of current is regulated by applying a high or low complementary metal-oxide semiconductor (CMOS) level to the gate of the sink transistor. As a result, there is a problem in that the amount of buffer current is regulated by only one step.

BRIEF SUMMARY

In an aspect of the present disclosure, an input buffer circuit comprises a buffer configured to receive an input signal and differentially amplify and buffer the received input signal, and a current regulator for regulating the amount of current in the buffer at a turn-on level in accordance with a level of a voltage inputted thereto.

In another aspect of the present disclosure, an input buffer circuit comprises a buffer configured to buffer an input signal and differentially amplify and buffer the received input signal, a current regulator for regulating the amount of current in the buffer in response to a control signal, and a controller for adjusting a level of a supply voltage and outputting the level-adjusted voltage as the control signal to the current regulator.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

In an input buffer circuit according to a preferred embodiment of the present invention, the amount of current used can be regulated by several steps. A turn-on level which depends on the voltage level of an inputted control signal can be applied to flexibly regulate the amount of current in a sink transistor of an input buffer that acts as a factor on the performance or characteristics of the input buffer. Therefore, it is possible to find and apply a proper amount of current at a failure analysis step, as well as at a design step.

Figure 1:
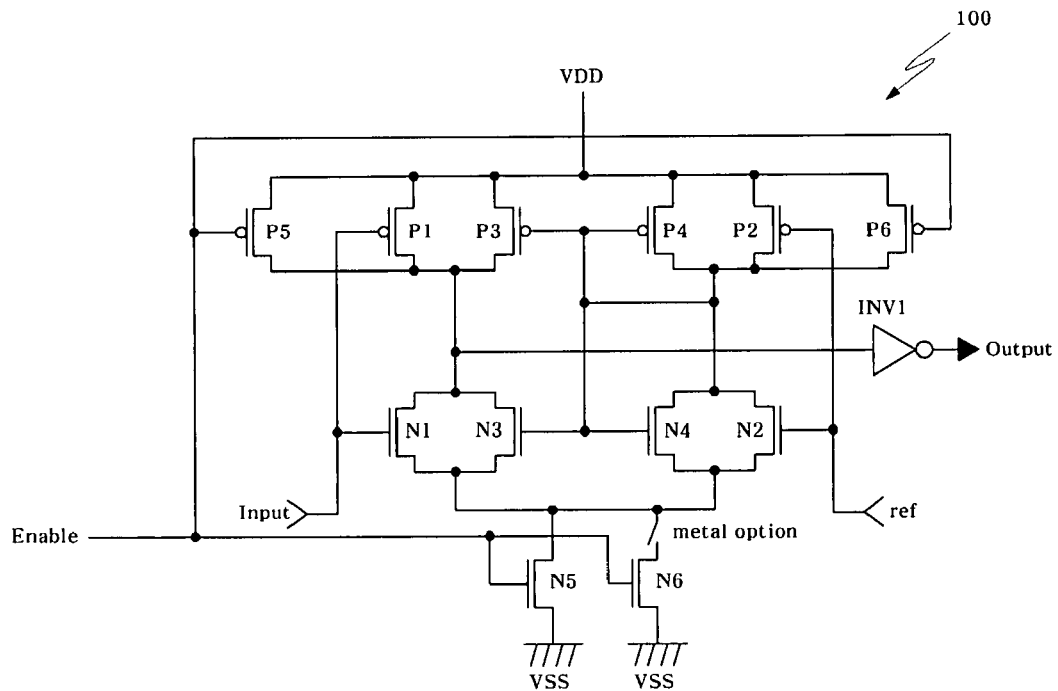
FIG. 1 is a circuit diagram of a conventional input buffer circuit.
Figure 2:
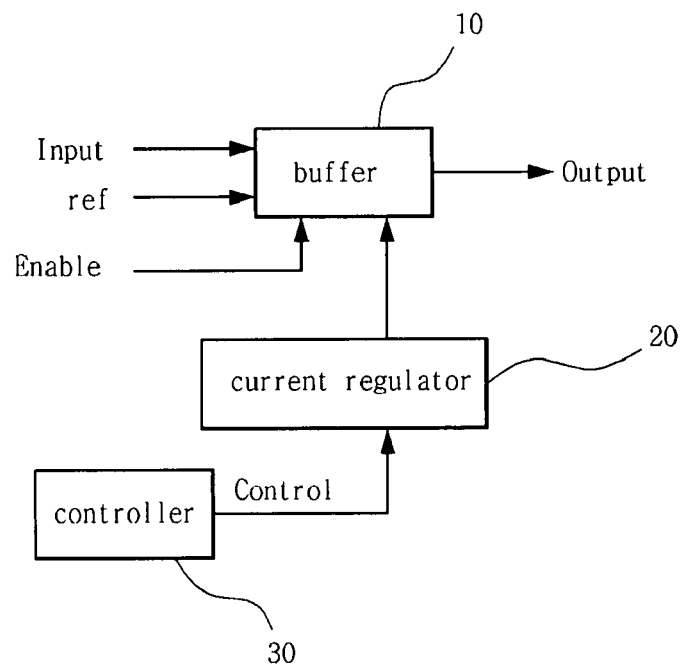
FIG. 2 is a block diagram showing the configuration of an input buffer circuit according to an embodiment of the present invention.
Figure 3:
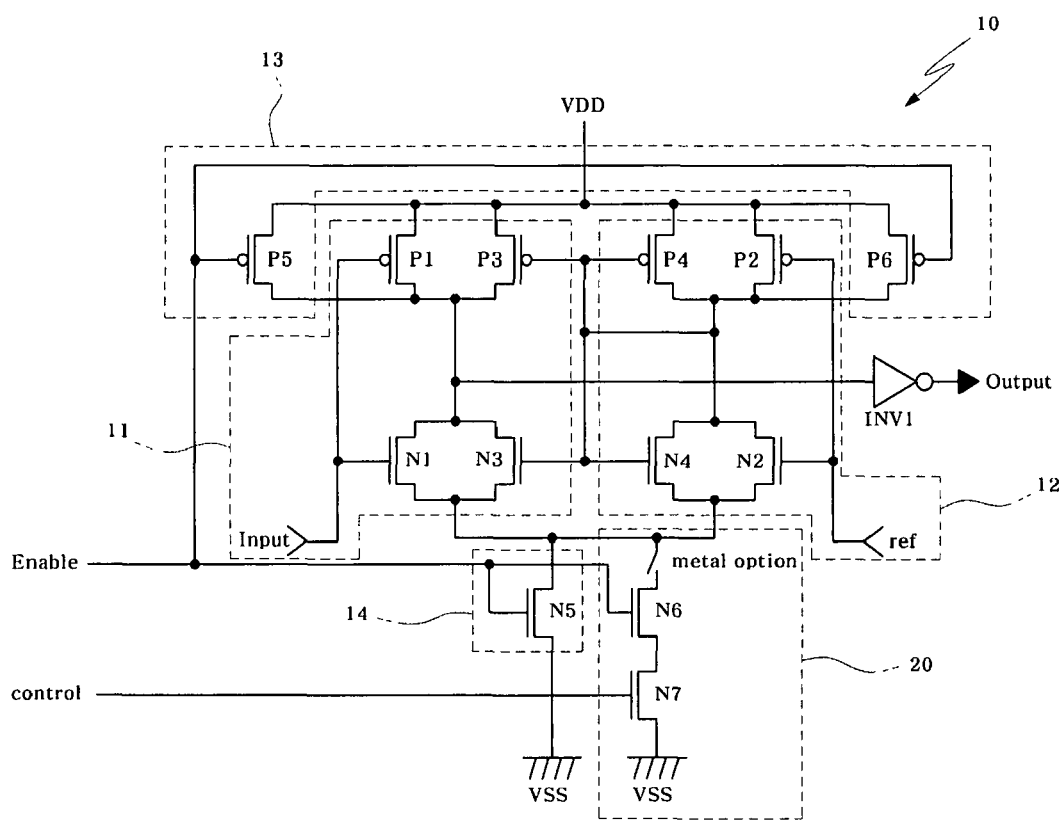
FIG. 3 is a circuit diagram of a buffer and current regulator shown in FIG. 2.
Figure 4A:
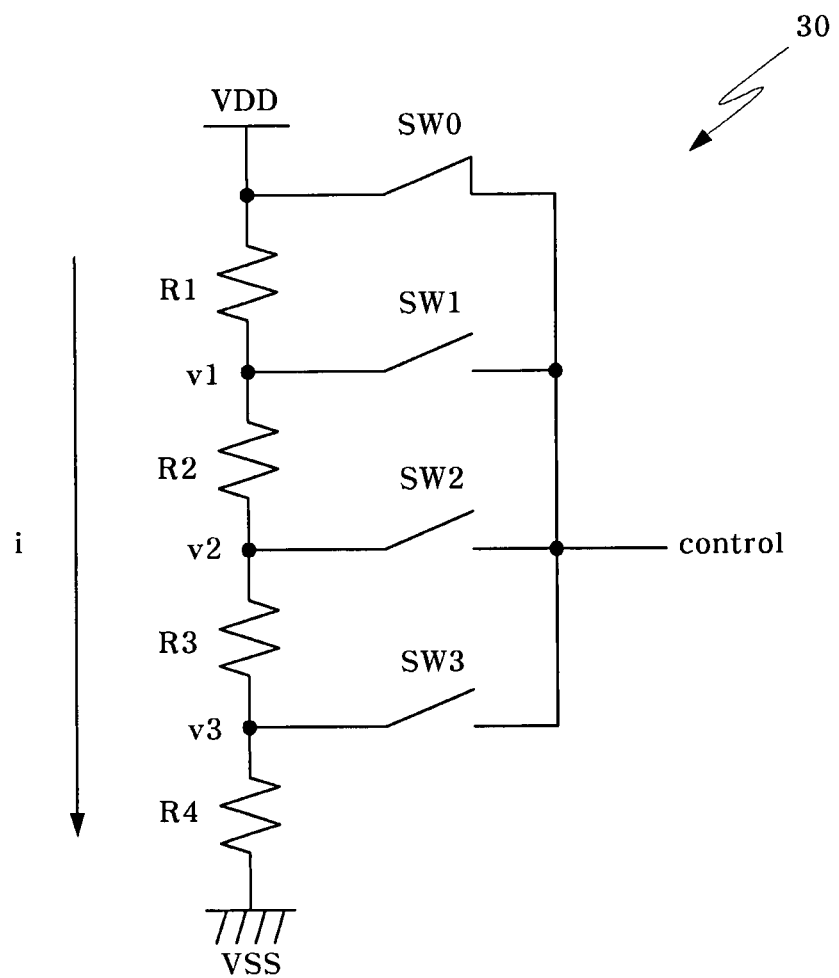
FIGS. 4A and 4B are circuit diagrams of different embodiments of a controller shown in FIG. 2.
Figure 4B:
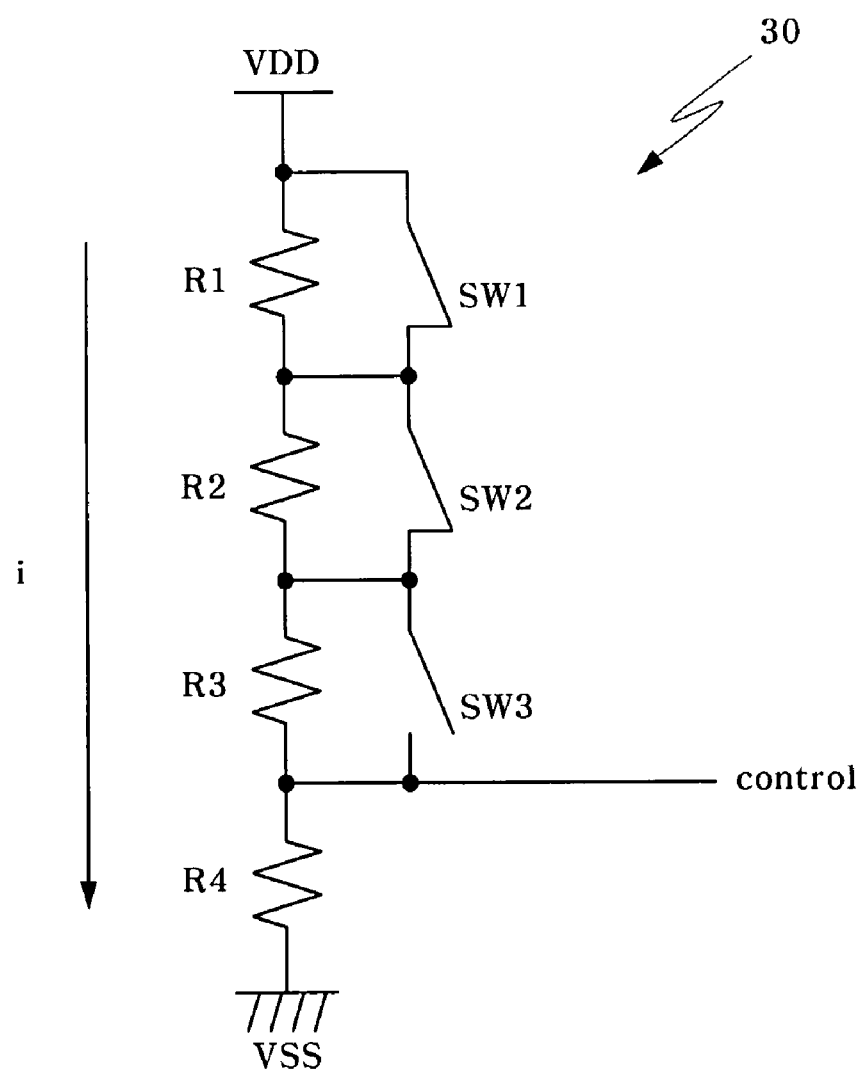

FIG. 2 is a block diagram showing the configuration of an input buffer circuit according to a preferred embodiment of the present invention, FIG. 3 is a circuit diagram of a buffer and current regulator shown in FIG. 2, and FIGS. 4A and 4B are circuit diagrams of different embodiments of a controller shown in FIG. 2.

As shown in FIGS. 2 and 3, the input buffer circuit according to a preferred embodiment of the present invention comprises a buffer 10 for receiving an input signal Input and differentially amplifying and buffering the received input signal Input, a current regulator 20 for regulating the amount of current in the buffer 10 in response to a control signal Control, and a controller 30 for adjusting the level of a supply voltage VDD and outputting the level-adjusted voltage as the control signal Control to the current regulator 20.

The buffer 10 includes a first driver 11 for performing a pull-up or pull-down driving operation in response to the input signal Input, a second driver 12 for performing a pull-up or pull-down driving operation in response to a reference signal, a first enabler 13 for enabling the buffer 10 in response to an enable signal Enable, and a second enabler 14 for enabling the buffer 10 in response to the enable signal Enable.

The current regulator 20 includes a first n-channel metal oxide semiconductor (NMOS) device N6 which is turned on in response to the enable signal Enable, and a second NMOS device N7 which is turned on to a level which is different depending on the voltage level of the control signal Control. The first NMOS device N6 and the second NMOS device N7 are connected in series between the drivers 11 and 12 of the buffer 10 and a ground voltage VSS.

The controller 30 includes, as shown in FIG. 4A, a voltage divider for adjusting the level of the supply voltage VDD according to on/off (closed/open) states of switches SW0, SW1, SW2 and SW3 and outputting the level-adjusted voltage as the control signal Control.

As shown in FIG. 4A, in the voltage divider, a plurality of resistors R1, R2, R3 and R4 are connected in series between the supply voltage VDD and the ground voltage VSS, and the switches SW0, SW1, SW2 and SW3 are connected in parallel. The switch SW0 is connected between the supply voltage VDD and the resistor R1, and each of the switches SW1-SW3 is connected between adjacent ones of the resistors R1-R4.

Alternatively, as shown in FIG. 4B, in the voltage divider, the resistors R1, R2, R3 and R4 may be connected in series between the supply voltage VDD and the ground voltage VSS, and each of the switches SW1, SW2 and SW3 may be connected in parallel to a corresponding one of the resistors R1-R3.

As described above, the input buffer circuit according to a preferred embodiment of the present invention comprises the buffer 10 including the drivers 11 and 12 which receive the input signal Input and differentially amplify and buffer the received input signal Input, and the current regulator 20 including the driver N7 which is connected between the drivers 11 and 12 of the buffer 10 on the one hand and the ground voltage VSS on the other hand, and drives the buffer 10 at a turn-on level which is different depending on the level of a voltage inputted thereto.

A description will hereinafter be given of the operation of the input buffer circuit with the above-stated configuration according to a preferred embodiment the present invention.

First, in FIGS. 2 and 3, when the enable signal Enable is high, the buffer 10 is enabled by the first enabler 13 and second enabler 14.

Then, in the buffer 10, the first driver 11 performs the pull-up or pull-down driving operation in response to the input signal Input, and the second driver 12 performs the pull-up or pull-down driving operation in response to the reference signal.

That is, the drivers 11 and 12 of the buffer 10 receive the input signal Input and differentially amplify and buffer the received input signal Input.

At this time, the current regulator 20 regulates the amount of current in the buffer 10 in response to the control signal Control, and the controller 30 adjusts the level of the supply voltage VDD and outputs the level-adjusted voltage as the control signal Control to the current regulator 20.

The current regulating operation of the input buffer circuit according to a preferred embodiment of the present invention will hereinafter be described in detail.

The enable signal Enable is applied to the gate of an NMOS device N5 of the second enabler 14 in the buffer 10 and to the gate of the first NMOS device N6 in the current regulator 20, which is an optional sink transistor. The enable signal Enable has a high or low CMOS level.

If a metal option connected to the drain of the first NMOS device N6 is open, the first NMOS device N6 is not used. If the metal option is closed, the first NMOS device N6 is used to increase the amount of current.

It should be noted here that the amount of current is also regulated through the second NMOS device N7 which is connected in series to the first NMOS device N6 and turned on to a level which is different depending on the voltage level of the control signal Control.

Figure 5:
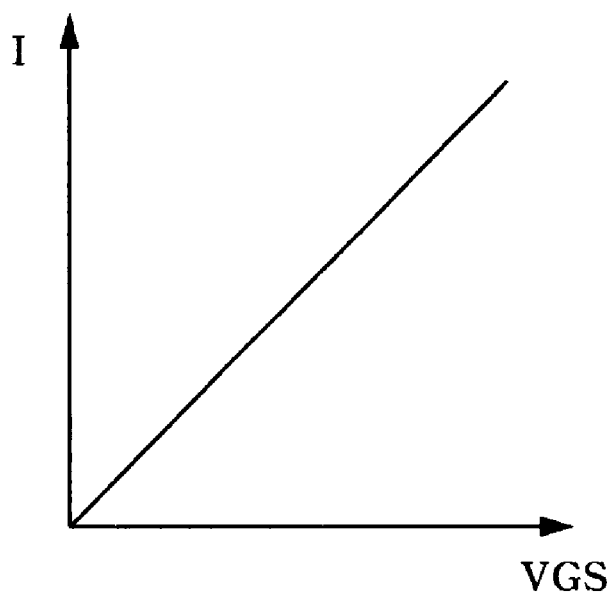
FIG. 5 is a graph illustrating a current-to-voltage characteristic of an NMOS device in the current regulator.

The amount of current flowing through the second NMOS device N7 is in proportion to a gate-source voltage VGS of the second NMOS device N7, as shown in FIG. 5. Because the gate voltage of the second NMOS device N7 corresponds to that of the control signal Control from the voltage divider and the source voltage thereof is the ground voltage VSS, the current control can be carried out depending on the voltage level of the control signal Control.

The voltage level of the control signal Control can be determined by adjusting the level of the supply voltage VDD by dividing the supply voltage VDD according to on/off states of the switches SW0, SW1, SW2 and SW3.

The level of the supply voltage VDD can be adjusted through the voltage divider in which the resistors R1, R2, R3 and R4 are connected in series between the supply voltage VDD and the ground voltage VSS, the switches SW0, SW1, SW2 and SW3 are connected in parallel, the switch SW0 is connected between the supply voltage VDD and the resistor R1, and each of the switches SW1-SW3 is connected between adjacent ones of the resistors R1-R4, as shown in FIG. 4A.

Current I is determined depending on the values of the resistors R1, R2, R3 and R4. That is, $I=VDD/(R1+R2+R3+R4)$ Also, $v1=VDD-(I*R1)$, $v2=VDD-(I*R2)$, and $v3=VDD-(I*R3)$. The voltage level of the control signal Control is determined according to the resistor values and on/off (closed/open) states of the switches SW0, SW1, SW2 and SW3.

For example, when the switch SW0 is closed and the remaining switches are open, the voltage level of the control signal Control is VDD. Also, the voltage level of the control signal Control is v1 when the switch SW1 is closed and the remaining switches are open, v2 when the switch SW2 is closed and the remaining switches are open, and v3 when the switch SW3 is closed and the remaining switches are open.

Alternatively, the level of the supply voltage VDD may be adjusted through the voltage divider in which the resistors R1, R2, R3 and R4 may be connected in series between the supply voltage VDD and the ground voltage VSS, and each of the switches SW1, SW2 and SW3 may be connected in parallel to a corresponding one of the resistors R1-R3, as shown in FIG. 4B.

Similarly, in this case, the voltage level of the control signal Control is determined according to the resistor values and on/off (closed/open) states of the switches SW1, SW2 and SW3.

From comparison between FIG. 4A and FIG. 4B, it can be seen that, although the voltage divider has the same number of resistors, namely, the same layout area, it can make the voltage level of the control signal into eight values in FIG. 4B, while making the voltage level of the control signal into four values in FIG. 4A. In both of the methods of FIGS. 4A and 4B, different voltage levels of the control signal are generated depending on the number and values of resistors.

As apparent from the above description, according to the present disclosure, a turn-on level which is different depending on the voltage level of a control signal can be applied flexibly to regulate the amount of current in a sink transistor of an input buffer. Therefore, it is possible to find and apply a proper amount of current at a DRAM failure analysis step, as well as at a DRAM design step.

Although the preferred embodiments of the present invention have been disclosed for illustrative purposes, those skilled in the art will appreciate that various modifications, additions and substitutions are possible, without departing from the scope and spirit of the disclosure and the accompanying claims.

The present application claims priority to Korean patent application number 10-2006-138795, filed Dec. 29, 2006, which is incorporated by reference in its entirety.

What is claimed is:

1. An input buffer circuit comprising:
a buffer configured to receive an input signal, and differentially amplify and buffer the received input signal;
a first enabler configured to enable the buffer in response to an enable signal; and
a current regulator configured to regulate the amount of current of the buffer, said current regulator comprising a first switching unit enabled in response to the enable signal, a second switching unit enabled in response to a control signal, and a metal option,
wherein the first enabler and the current regulator are coupled in parallel to said buffer, and the first switching unit, the second switching unit and the metal option are coupled to each other in series.

2. The input buffer circuit according to claim 1, wherein the first switching unit comprises a first n-channel metal oxide semiconductor (NMOS) device turned on in response to the enable signal,
the second switching unit comprises a second NMOS device turned on in response to the control signal, and
the metal option directly coupled between the buffer and the first NMOS device,
wherein the first NMOS device and the second NMOS device are connected in series between the buffer and a ground voltage.

3. The input buffer circuit according to claim 1, wherein the buffer comprises:
a first driver configured to perform a pull-up or pull-down driving operation in response to the input signal;
a second driver configured to perform the pull-up or pull-down driving operation in response to a reference signal; and
a second enabler configured to enable the buffer in response to the enable signal.

4. The input buffer circuit according to claim 1, wherein when the current regulator is disabled in response to the control signal and the enabler is enabled in response to the enable signal, the buffer is enabled by the enabler.

5. An input buffer circuit comprising:
a buffer configured to receive an input signal and differentially amplify and buffer the received input signal;
a first enabler configured to enable the buffer in response to an enable signal;
a current regulator configured to regulate the amount of current of the buffer, said current regulator comprising a first switching unit enabled in response to the enable signal, a second switching unit enabled in response to a control signal, and a metal option; and
a controller configured to adjust a level of a supply voltage in response to the input signal and output the level-adjusted voltage as the control signal to the current regulator,
wherein the first enabler and the current regulator are coupled in parallel to said buffer, and the first switching unit, the second switching unit and the metal option are coupled to each other in series.

6. The input buffer circuit according to claim 5, wherein the first switching unit comprises a first NMOS device turned on in response to an enable signal,
the second switching unit comprises a second NMOS device turned on to a level in accordance with a voltage level of the control signal and
the metal option directly coupled to and between the buffer and the first NMOS device,
wherein the first NMOS device and the second NMOS device are connected in series between the buffer and a ground voltage.

7. The input buffer circuit according to claim 5, wherein the controller comprises a voltage divider configured to adjust the level of the supply voltage in response to switching and output the level-adjusted voltage as the control signal.

8. The input buffer circuit according to claim 7, wherein the voltage divider comprises:
a plurality of resistors connected in series between the supply voltage and a ground voltage; and
a plurality of switches, each of the switches being connected in parallel to a corresponding one of the resistors, excluding a last one of the resistors.

9. The input buffer circuit according to claim 7, wherein voltage divider comprises:
a plurality of resistors connected in, series between the supply voltage and a ground voltage; and
a plurality of switches connected in parallel, a first one of the switches being connected between the supply voltage and a first one of the resistors, each of the remaining switches being connected between adjacent ones of the resistors.

10. The input buffer circuit according to claim 5, wherein the buffer comprises:
a first driver configured to perform a pull-up or pull-down driving operation in response to the input signal;
a second driver configured to perform the pull-up or pull-down driving operation in response to a reference signal; and
a second enabler configured to enable the buffer in response to the enable signal.

* * * * *